United States Patent
He et al.

(10) Patent No.: US 8,667,373 B2
(45) Date of Patent: Mar. 4, 2014

(54) FRAME BOUNDARY DETECTION AND SYNCHRONIZATION SYSTEM FOR DATA STREAM RECEIVED BY ETHERNET FORWARD ERROR CORRECTION LAYER

(75) Inventors: Yin He, Shanghai (CN); Yi Fan Lin, Shanghai (CN); Yang Liu, Shanghai (CN); Hao Yang, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 543 days.

(21) Appl. No.: 12/894,274

(22) Filed: Sep. 30, 2010

(65) Prior Publication Data
US 2011/0078545 A1    Mar. 31, 2011

(30) Foreign Application Priority Data
Sep. 30, 2009    (CN) .......................... 2009 1 0177335

(51) Int. Cl.
*H03M 13/00*    (2006.01)
(52) U.S. Cl.
USPC ............ 714/775; 714/752; 714/786; 714/789
(58) Field of Classification Search
None
See application file for complete search history.

(56) References Cited

U.S. PATENT DOCUMENTS

| | | | |
|---|---|---|---|
| 5,923,680 A * | 7/1999 | Brueckheimer et al. | ...... 714/758 |
| 2007/0157060 A1* | 7/2007 | Ganga et al. | .................. 714/752 |
| 2009/0187808 A1 | 7/2009 | Nichols | |
| 2012/0179950 A1* | 7/2012 | He et al. | ........................ 714/752 |

* cited by examiner

*Primary Examiner* — Albert Decady
*Assistant Examiner* — Justin R Knapp
(74) *Attorney, Agent, or Firm* — Michael J. Lestrange

(57) ABSTRACT

The present invention discloses a frame boundary detection system and a synchronization system for a data stream received by an Ethernet Forward Error Correction layer. The frame boundary detection system includes a shifter, two descramblers, a syndrome generator and trapper. The error trapper includes a big-little endian mode controller for controlling the big-little endian conversion of the error trapper. If the error trapper operates in the big endian mode, the error trapper implements the function of the syndrome generator, operates at the same time with the syndrome generator, and performs a second FEC check, wherein when the shifter performs the FEC check by intercepting data with a length of one frame plus A bits, two start positions of the frame can be verified, where A is a positive integer less than a length of one frame. The invention can improve the frame boundary detection speed and the frame synchronization speed, and increase only a few hardware overheads.

16 Claims, 5 Drawing Sheets

Before frame synchronization

FRAME BOUNDARY DETECTION AND SYNCHRONIZATION SYSTEM FOR DATA STREAM RECEIVED BY ETHERNET FORWARD ERROR CORRECTION LAYER

TECHNICAL FIELD

The present invention generally relates to a data processing system, and specifically to a frame boundary detection system and synchronization system for a data stream received by an Ethernet Forward Error Correction layer.

BACKGROUND

The Chapter 74 of IEEE802.3ap-2007, the latest version of which is IEEE 802.3-2008, and IEEEP802.3D1.2 define an FEC (Forward Error Correction) sublayer applied to a BASE-R physical layer of 10G Ethernet. The criterion of the FEC sublayer reduces the BER rate of a system from $10^{-7}$ to $10^{-12}$. Also, this criterion is applicable to applications of 40G/100G Ethernet.

In order to be compatible with different Ethernet application layers, protocols provide that the FEC layer compresses an original frame header to leave space so as to load an FEC check bit, thus assuring that the layer keeps the same frame length (the frame length defined in the Chapter 74 of IEEE 802.3ap-2007 is 2112 bits) as other application layers. However, such a processing method results in a reception terminal being very difficult to identify frame boundaries between respective frames and requiring a great deal of time to synchronize with frames of a transmission terminal so as to find out correct positions of the frame boundaries.

Figure 1:
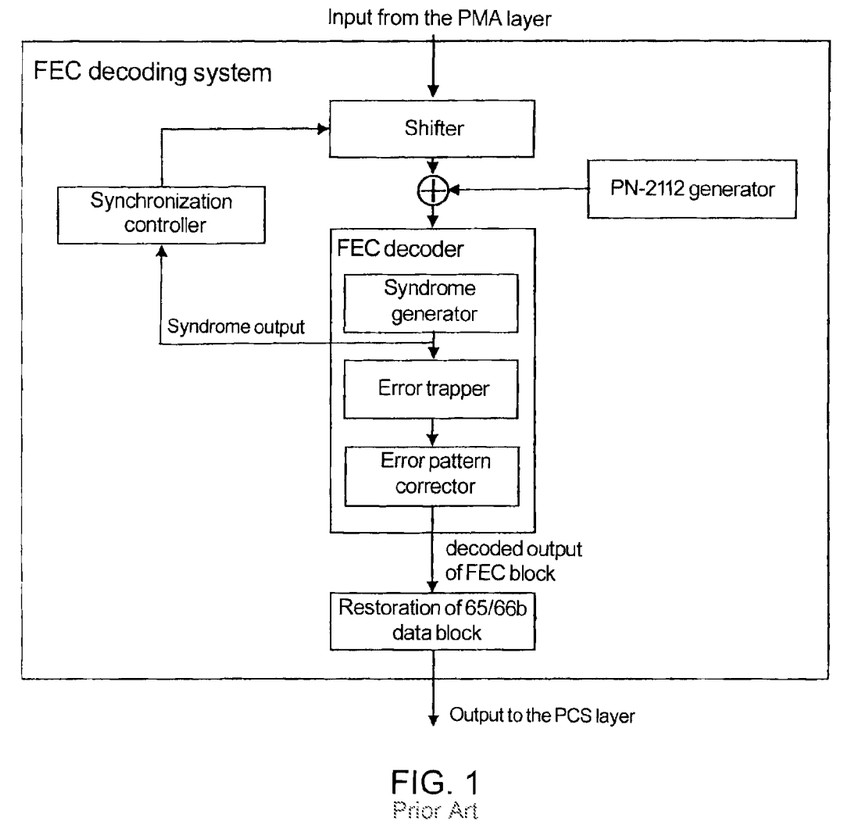
FIG. 1 shows a general circuit structure for realizing frame synchronization as defined in the Chapter 74 of IEEE 802.3ap-2007.

FIG. 1 shows a structural diagram of an FEC decoding system, which receives the input from a PMA (PHYSICAL MEDIUM ATTACHMENT) layer and outputs a processing result to a PCS (PHYSICAL CODING SUBLAYER) layer, defined in the Chapter 74 of IEEE 802.3ap-2007. The FEC decoding system includes five modules: a shifter, which shifts data received from the PMA layer; a PN-2112 generator, which is used to generate a PN2112 sequence which will be used to apply an XOR logic operation with the data shifted by the shifter to carry out a descrambling operation on the received data; the data shifted by the shifter are input into a FEC decoder after the XOR operation is applied to the data generated by the PN-2112 generator; and the FEC decoder, which performs Forward Error Correction on the input data, and outputs the error-corrected data. The output data pass through a 65/66 data block restoration module, which is capable of performing a frame header restoration on the FEC-decoded data and restoring the payload of 2080 bits in each FEC frame data into 32 frames of PCS frame with a length of 66 bits, and then the output of the module enters into the PCS layer. The FEC decoder further outputs the generated syndrome to a synchronization controller for the control of the FEC synchronization, and the output of the synchronization controller is sent to the shifter so as to control the shift operation.

The FEC decoder itself further comprises a syndrome generator, trapper and pattern corrector. The FEC decoder is used for Forward Error Correction, but it also is used for the frame synchronization with the transmission terminal due to the particularity of relevant protocols of the present invention.

A synchronization procedure used by the circuit structure of FIG. 1 includes the following steps:
a) an assumed position of the frame boundary is tested;
 a1) a position of frame boundary is assumed by the shifter, and taking the assumed position of frame boundary as a start, the PN-2112 generator is used to perform a descrambling operation on the received data; and
 a2) the syndrome generator performs a FEC check on the data of one frame which takes the assumed frame boundary as a start position;
  i) if the check is not matched (the received check bit is not equal to the check bit obtained from the operation), the synchronization controller may control the shifter to make the assumed position of frame boundary leap over a position of one bit, and then step a) is retried;
b) for one assumed frame boundary, the synchronization controller may confirm all FEC checks for consecutive n frames to be correct according to the output results of the syndrome generator;
 b1) if the FEC check for any one of the consecutive n frames is incorrect, the synchronization controller may control the shifter to make the assumed position of frame boundary leap over a position of one bit, and the entire frame synchronization procedure is restarted; and
 b2) if the synchronization controller detects that all FEC checks for the received consecutive n frames are correct, it is to enter into step c);
c) the frame synchronization is established; and
d) if the synchronization controller detects that all FEC checks for the received consecutive m frames are incorrect, the frame synchronization is considered to be lost, and the entire frame synchronization procedure is restarted.

For a frame length of 2112 bits, the above steps are repeated for 2112 times at most to traverse all of 2112 possible positions to find out the correct position of frame boundary. In the above description, representative data is taken as m=8, n=4.

Figure 2:
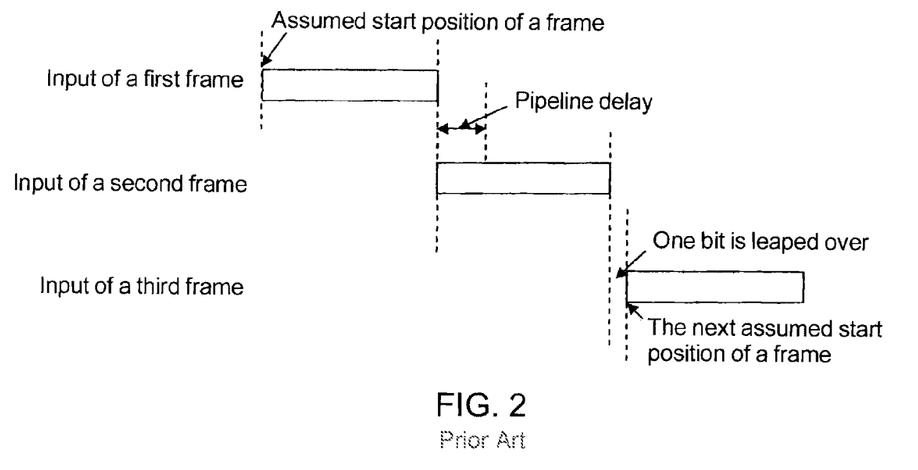
FIG. 2 schematically shows how the general method performs frame synchronization.

FIG. 2 schematically shows how a general method performs the frame synchronization. According to FIG. 2, at the beginning, the frame synchronization logic cannot determine the correct start position, thus needs to assume a frame start position in a frame to check this frame. However, when the data of the last bit of a first frame enters into the frame synchronization logic, the frame synchronization logic cannot generate the check result for this frame immediately. This is because there may be a delay caused by a pipeline structure based design in the hardware implementation. The delay, caused by some functional logic such as descrambling logic, is unavoidable. After the pipeline delay has been incurred, if the frame synchronization logic detects that the position of the first frame boundary is incorrect, the frame synchronization logic needs to make the subsequently assumed position of frame boundary leap over one bit as the next assumed frame boundary. At this time, due to the pipeline delay as shown in FIG. 2, it is too late to begin detecting the data of the second frame after one bit is leaped over from the start position of the frame boundary of a second frame. Consequently, the frame synchronization logic has to discard the second frame and begin sampling a third frame. The frame synchronization logic may leap over one bit based on the frame boundary of the third frame, and repeat the check operation in the first frame on the third frame.

In this way, in the worst case, the frame synchronization logic needs to detect 2112 frames, to discard 2111 frames, and to carry out the operation of leaping over one bit for 2111 times. This needs to take (2112+2111)*2112+2111=8,921,087 BT (bit time) to obtain a correct frame boundary, that is, a correct start bit of a frame. Compared with other high speed interfaces with similar rate (about 600,000BT for SATA2.0 and 500,000BT for PCIE2.0), such frame synchronization time is much longer.

SUMMARY OF THE INVENTION

The synchronization controller needs to locate a correct frame start position inside a frame, so that the frame synchronization can be completed. Disadvantages of the general method are that a detection procedure for one time can only detect one frame boundary during a procedure of looking for correct frame start positions.

Different from the above method as described in IEEE 802.3ap-2007 Criterion, the claimed method optimizes a frame boundary detection system for a data stream received by an Ethernet Forward Error Correction layer as well as a frame synchronization system for the data stream of the Forward Error Correction layer. By means of detecting two frame boundaries at one time, improvement of the frame boundary detection speed is achieved and fast frame synchronization is realized. Also, the invention increases only a few hardware overheads while nearly doubling the frame boundary detection speed and the frame synchronization speed.

According to one a first embodiment, a frame boundary detection system for a data stream received by an Ethernet Forward Error Correction layer is disclosed, the system comprising:

a shifter for intercepting data of one frame plus A bits from the data stream, wherein A bits are less than the length of one frame, and A is a positive integer;

two descramblers of which a first descrambler performs a descrambling operation on the data of one frame starting from the first bit of the data of one frame plus A bits, and a second descrambler performs a descrambling operation on the data of one frame starting from the (A+1)th bit of the data of one frame plus A bits;

a syndrome generator for performing a first FEC check on the data descrambled by the first descrambler; and a error trapper including a big-little endian mode controller for controlling the conversion of the big-little endians of the error trapper, wherein the error trapper performs a second FEC check on the data descrambled by the second descrambler if the error trapper operates in the big endian mode, wherein the first bit of the data of one frame plus A bits is the start position of the frame if the first FEC check is correct, and the (A+1)th bit of the data of one frame plus A bits is the start position of the frame if the second FEC check is correct.

According to another aspect of the present invention, a synchronization system for a data stream received by an Ethernet Forward Error Correction layer is disclosed, the system comprising:

a shifter for intercepting data of one frame plus A bits from the data stream, wherein A bits is less than the length of one frame, and A is a positive integer;

two descramblers of which a first descrambler performs a descrambling operation on the data of one frame starting from the first bit of the data of one frame plus A bits, and a second descrambler performs a descrambling operation on the data of one frame starting from the (A+1)th bit of the data of one frame plus A bits;

a syndrome generator for performing a first FEC check on the data descrambled by the first descrambler;

trapper including a big-little endian mode controller for controlling the conversion of the big-little endian of the error trapper, wherein the error trapper performs a second FEC check on the data descrambled by the second descrambler if the error trapper operates in the big endian mode, wherein the first bit of the data of one frame plus A bits is a start position of the frame if the first FEC check is correct, and the (A+1)th bit of the data of one frame plus A bits is the start position of the frame if the second FEC check is correct; and a synchronization controller for controlling the frame synchronization, wherein the synchronization controller validates the FEC checks of the subsequent n data each having a length of consecutive one frame after the frame boundary detection system detects a start position of the frame, and if the synchronization controller determines that all FEC checks of the subsequent n data each having a length of consecutive one frame are correct, the synchronization controller determines that the data are frame synchronous.

The method disclosed herein is applicable to not only a 10G/40G/100G Ethernet as provided in the criterion but also any Broad Band Ethernet. Meanwhile, the method of the invention is applicable to not only a BASE-R transmission medium employed in the criterion but also an Ethernet employing any transmission media.

BRIEF DESCRIPTION OF THE DRAWINGS

The above and other objects, features and advantages of the present invention will become more distinct by more detailed description of exemplary embodiments of the invention in the attached drawings in which the identical reference numbers generally represent like parts in the exemplary embodiments of the present invention.

DESCRIPTION OF THE PREFERRED EMBODIMENTS

The preferred embodiments of the present invention will be described in more details with reference to the attached drawings in which the preferred embodiments of the invention are shown. However, the invention can be implemented in various forms and should not be comprehended to be limited to the embodiments explained here. Instead, these embodiments are provided in order to make the invention more thorough and integral and completely convey the scope of the invention to those skilled in the art.

In a prior art scheme, due to the presence of a pipeline structure in a hardware, when a method of leaping over a position of one bit is employed, only one frame boundary can be detected and nearly a half of frames are discarded, which prolongs the frame boundary detection time and slows the frame synchronization speed.

The present invention optimizes the structure of an FEC decoder at a reception terminal, thus speeding up the frame synchronization procedure.

Specifically, the invention improves the error trapper, which can be operated not only in its normal operation mode, that is, the little endian mode as described in the invention, but also in a syndrome generation mode, that is, the big endian mode implementing a function of generating a syndrome as described in the invention. In this way, when the frame synchronization operation is performed, the improved error trapper and a syndrome generator from the original system can simultaneously perform the syndrome generation operation, frame boundary detection, and frame synchronization operations in parallel. In this way, the synchronization speed of FEC is greatly increased, meanwhile, hardware resources of the system are not significantly impacted. In a specific implementation, the improved error trapper implements different functional modes by changing the big endian mode and little endian mode of its data.

For convenience of description below, it is assumed that there is only a 1-bit data input in serial per clock cycle. In a practical circuit implementation, the parallel input and processing for arbitrary bits of data may be supported by expanding the circuit structure.

Figure 3:
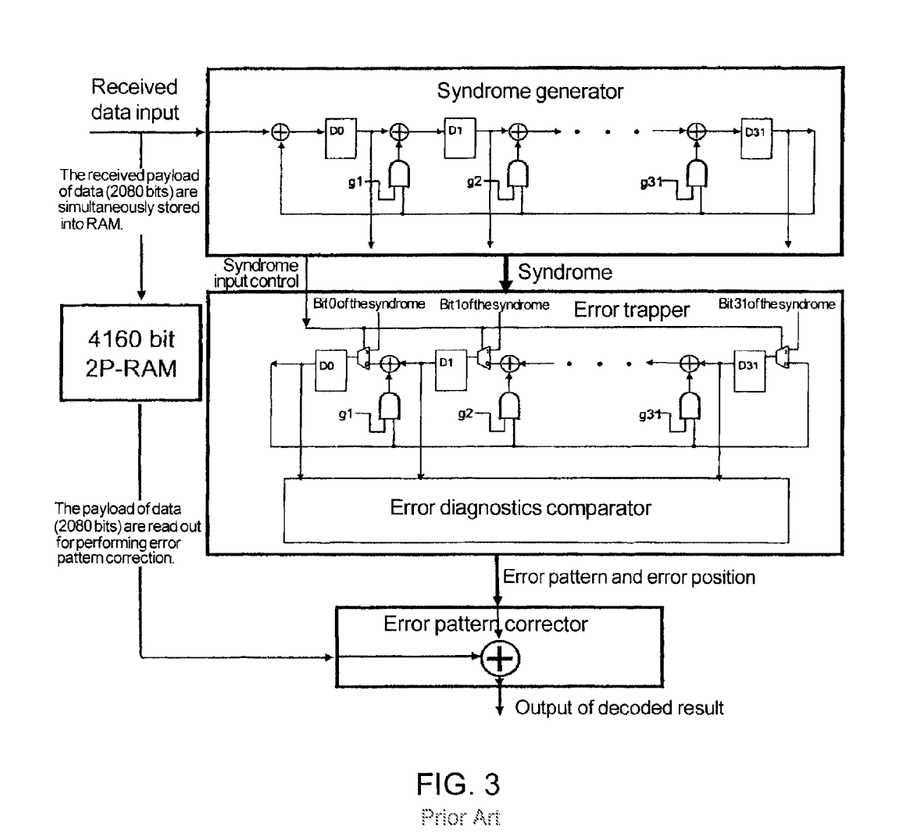
FIG. 3 shows the detailed circuit structure of the FEC decoder in FIG. 1.

FIG. 3 shows a detailed circuit structure of the FEC decoder in FIG. 1. Here, only the circuit specifically related to the present invention is shown, and there are other circuits which are not directly related to the invention and thus are not shown. According to FIG. 3, the FEC decoder employs a pipeline structure, and includes three modules: a syndrome generator, trapper and pattern corrector. The circuit of FIG. 3 is used for Forward Error Correction decoding. The circuit firstly performs the frame synchronization for the received data and the transmitted data, and performs the operations of the error correction and decoding etc. upon the frame synchronization. Its basic principle is that a modular operation for g(x) is performed for the input data frame by the syndrome generator after the data input is received, wherein g(x) is a generation polynomial of the FEC, and the obtained residue is the syndrome. Corresponding to the syndrome generator part in the structural diagram for the FEC decoder, D31 is the most significant bit and D0 is the least significant bit. $g_1$-$g_{31}$ are coefficients of the generation polynomial g(x) of the FEC. Because the FEC operation is executed within the Galois field, addition/subtraction operations within the field all correspond to an XOR operation. Thus, the circuit of the syndrome generator is equivalent to a division circuit of shift subtraction, except that the quotient obtained by the division is discarded and the residue is left as the syndrome. If the syndrome is 0, it indicates that the frame data is correctly received, and the FEC check is correct. It may be determined that the received data are synchronous with the frame of the transmission terminal when the checks for some consecutive frames are correct. Before the determination of the frame synchronization, if the syndrome is not 0, it indicates that the FEC check for the frame data is incorrect, so that it is needed to re-receive the input data and to re-determine the position of the frame boundary.

After the determination of the frame synchronization, the error correction procedure is performed. Therefore, only the syndrome generator operates in the FEC decoder before the frame synchronization is achieved. The error trapper and error corrector are started only after the frame synchronization is completed.

In this way, from the point of view of the data frame synchronization, only the syndrome generator, the PN-2112 generator, the descrambler and the synchronization controller may be applied to the frame boundary detection and synchronization. Here, the PN-2112 generator is used to generate a PN-2112 sequence which is used to perform a descrambling operation with the data shifted by the shifter through the descrambler. The descrambler may be implemented by using one or more XOR gates or combinational logic. After the descrambling operation is performed on the data generated by the PN-2112 generator, the data shifted by the shifter are input into the syndrome generator of the FEC decoder to generate a syndrome output to the synchronization controller for controlling the FEC frame synchronization. Also, the output of the synchronization controller controls the shifter.

As shown in FIG. 3, the syndrome generator includes 32 registers, 32 XOR gates and 31 AND gates. The input of each AND gate is the most significant bit D31 of the registers and the coefficient $g_x$ of the generation polynomial g(x) of the corresponding position respectively, while the output of the AND gate is delivered into the register of the more significant bit after the XOR operation with the output of the register of the less significant bit is performed. On the whole, the circuit shown in FIG. 3 for the syndrome generator is a 32-order linear feedback shift register (LFSR). After all of the data for each frame are input into the syndrome generator, the outputs of all registers constitute the syndrome which is input into the error trapper. Meanwhile, the syndrome generator further comprises some other circuits such as a FEC check circuit and so on which are not shown in FIG. 3.

However, the existing error trapper is composed of a 32-bit register, 31 XOR gates (because they have no serial data input terminal), 31 AND gates and 32 selectors. The input of each AND gate is the least significant bit D0 of the register and the coefficient $g_x$ of the generation polynomial g(x) of the corresponding position respectively, and the output of the AND gate is delivered into the register of the less significant bit after the XOR operation with the output of the register of the more significant bit is performed. On the whole, when excluding the selectors, the circuit shown in FIG. 3 for the error trapper is a 32-order linear feedback shift register. The selectors are controlled by a syndrome output control signal, and the syndrome or the operation result of the XOR gate is selected to be delivered into the register.

In the existing error trapper, for the data of each frame, the syndrome input control terminal is set high for one cycle for loading the syndrome, and for rest cycles, the circuit performs operation of ((.)/x)mod g(x) so as to generate pattern for comparison of the results of the error trapper operation.

By carefully analyzing the inner structures of the syndrome generator and the error trapper, it can be seen that each module includes a linear feedback shift register based on the same generation polynomial. The biggest difference is the shifting directions of the code words, that is, the syndrome generator shifts rightwards while the error trapper shifts leftwards.

The improved error trapper proposed by the present invention may make the error trapper operate in the big endian mode (the syndrome generator mode) or the little endian mode (the error trapper mode) by changing the big endian mode and the little endian mode of the modules in the structure of the existing error trapper. Here, the definitions of the big endian and the little endian well known by those skilled in the art are briefly introduced as follows: for 32 bit data words, big endian means the most significant bit (MSB) is at D0 and the least significant bit (LSB) is at D31, conversely little endian is defined as with the MSB located at D31 and the LSB located at D0.

Figure 4:
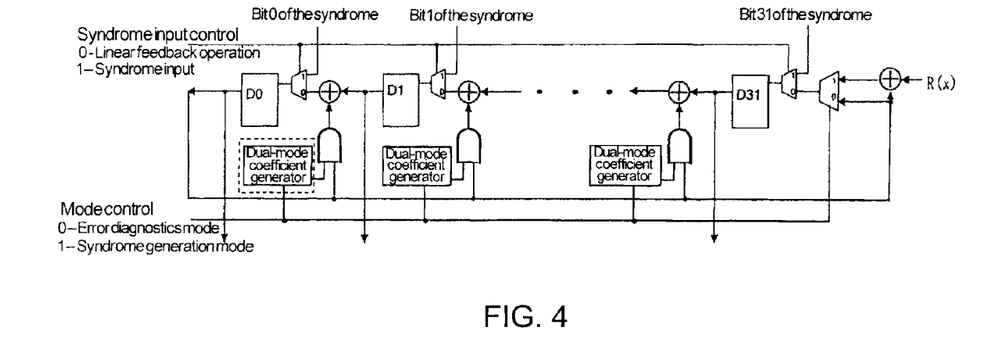
FIG. 4 shows a hardware structure of an improved error trapper according to an embodiment of the invention.

FIG. 4 shows a hardware structure of an improved error trapper according to a first embodiment. The error trapper includes a 32-order linear feedback shift register, 32 selectors and a big-little endian mode controller. The 32-order linear feedback shift register is composed of 32 registers, 31 XOR gates and 31 AND gates. The input of each AND gate is the least significant bit D0 of the register and the coefficient $g_x$ of the generation polynomial g(x) corresponding to position x respectively, and the output of each AND gate is delivered into the register of the less significant bit after being performed XOR operation with the output of the register of the more significant bit. The 32 selectors may be used for the error trapper shielding the syndrome generated by the syndrome generator in the big endian mode. The big-little endian mode controller includes 31 dual-mode coefficient generators, a selector and a XOR gate. The 31 dual-mode coefficient generators are used to select the values of the input coefficients of the AND gates in different operation modes. The selector and the XOR gate are located in front of the input of the register of the most significant bit D31 for selecting either the value of D0 or a value after D0 and data of one frame R(x) which start from the (A+1)th data of the received data of one frame plus A bits being performed XOR operation to be delivered into D31, where A is a positive integer less than a length of one frame. The control terminal of the selector is controlled by the "mode control" signal. If the "mode control" signal is in big endian mode, a value after D0 and the data of one frame R(x) which start from the (A+1)th data of the received data of one frame plus A bits are XORed and selected to be output to the selector, and if the "mode control" signal is in little endian mode, the value of D0 is selected to be output to the selector. In this way, the data of one frame plus A bits can be input at one time, where A is a positive integer less than a length of one frame. The syndrome generator performs an FEC check on the data of one frame starting from the first data of the data of one frame plus A bits, while the error trapper operating in the big endian mode performs an FEC check on the data of one frame R(x) starting from the $(A+1)^{th}$ data of the data of one frame plus A bits.

Figure 5:
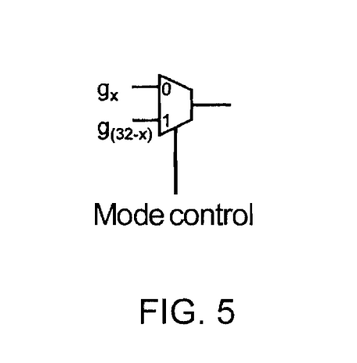
FIG. 5 shows a circuit structure of one embodiment for a dual-mode coefficient generator.

FIG. 5 shows a circuit structure of one embodiment for a dual-mode coefficient. The dual-mode coefficient generator is a selector of which the control terminal is controlled by the "mode control" signal. If the "mode control" signal indicates the big endian mode, $g_{32-x}$ which is the coefficient $g_{32-x}$ of the generation polynomial g(x) corresponding to position 32-x, is selected to be input into each AND gate, and if the "mode control" signal indicates the little endian mode, $g_x$ is selected to be input into each AND gate.

According to FIG. 5, when operating in its normal mode, a "mode control" signal line is set as 0, and the error trapper runs in the little endian mode. The whole circuit function is equivalent to the existing error trapper. It receives the syndrome generated by the syndrome generator in an order that the most significant bit is at D31 and the least significant bit is at D0. The order of its output error patterns is also that the most significant bit is at D31 and the least significant bit is at D0.

When the "mode control" signal line is set as 1, and the syndrome input control shields the syndrome generated by the syndrome generator, the error trapper operates in the big endian mode to implement the function of syndrome generation. The equivalent circuit for the error trapper operating in the big endian mode is as shown in FIG. 6.

Figure 6:
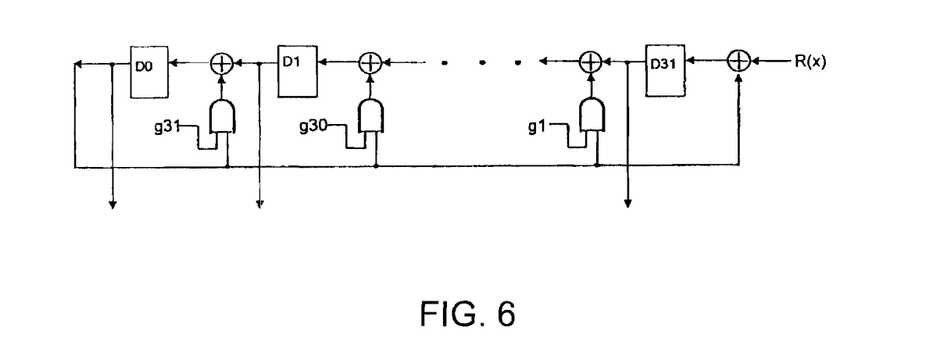
FIG. 6 shows an equivalent circuit of an error trapper operating in the big endian mode.

According to FIG. 6, compared with the normal mode, the order of parameters for each AND gate node is reversed. The bits of code words are input into this circuit from the right terminal of the LFSR. After the FEC check is completed, the syndrome is output in parallel on D0:D31. At this time, the output order of the syndrome is that the most significant bit is at D0 and the least significant bit is at D31.

It should be known by those skilled in the art that the correspondence between the "mode control" signal line being set as either 0 or 1 and the big endian mode and little endian mode in FIG. 5 and FIG. 6 is described according to the above circuit. Apparently, if an inverter is added, the correspondence is just contrary. Thus, the "mode control" signal line can be used to control the big endian mode and little endian mode, but the means of controlling endian mode is not exclusive.

Before the FEC achieves synchronization, the critical test is whether or not the syndrome is 0, while the big endian and little endian orders of the syndrome output can be totally ignored. Thus, it is not necessary to add any word big-little endian conversion logic after the error trapper to realize the conversion of the syndrome from the big endian to the little endian.

Figure 7A:
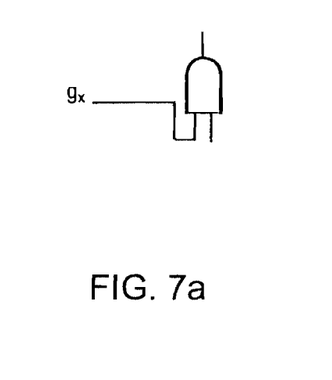
FIGS. 7a and 7b show a circuit structure of another embodiment for the dual-mode coefficient generator in FIG. 4.
Figure 7B:
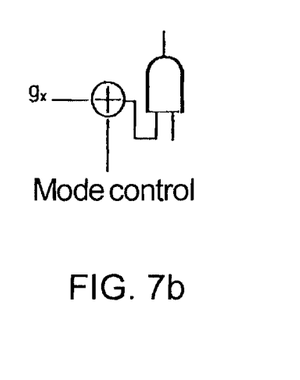

FIG. 7a and FIG. 7b show a circuit structure of another embodiment for the dual-mode coefficient generator. Because the coefficients for the generation polynomial are definite, each group $[g_x, g_{32-x}]$ is pre-compared artificially in the circuit structure, and the selection may not be made and $g_x$ is directly propagated to the input of the AND gate, if the two coefficients are equal, and $g_x$ after the XOR operation, the mode control is delivered into the AND gate, if the two coefficients are not equal. Thus, the dual-mode coefficient generator may make the selection according to the coefficients of Forward Error Correction generation polynomial g(x), that is, if the coefficient $g_x$ of the generation polynomial g(x) corresponding to the position x and the coefficient $g_{32}$-x of the generation polynomial g(x) corresponding to the position 32-x are equal to each other, $g_x$ is input into each AND gate, which corresponds to FIG. 7a; otherwise, $g_x$ after the XOR operation, the "mode control" signal is input into each AND gate, which corresponds to FIG. 7b.

Figure 8:
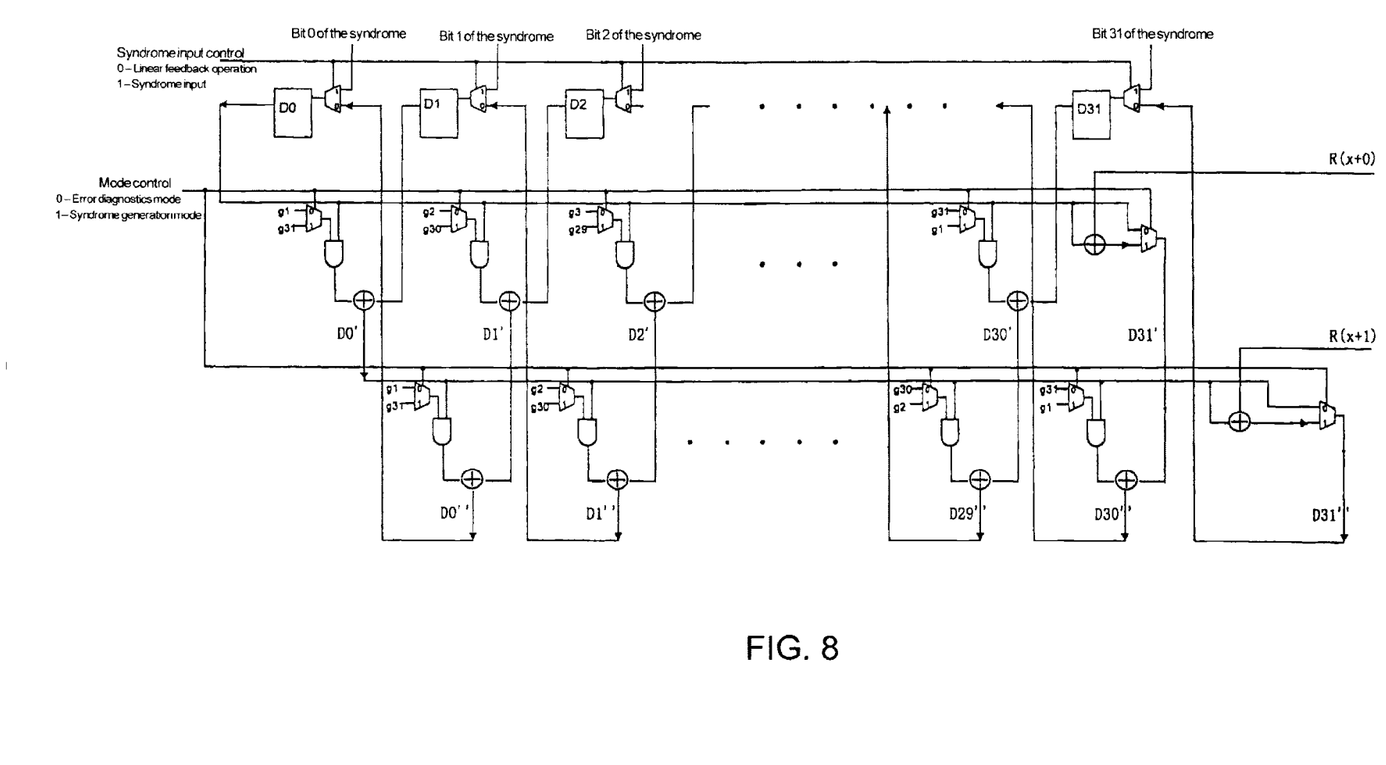
FIG. 8 shows a structural diagram of a circuit expanded according to a parallel input of 2 bits per clock cycle.

Further, for the case of any-bit parallel input, FIG. 8 shows a structural diagram of a circuit expanded according to a parallel input of 2 bits per clock cycle. As shown in FIG. 8, when operating in the error diagnostics mode, the "mode control" signal line is set as the little endian mode or the error trapper mode, and the circuit can generate two groups of error patterns D0'~D31' and D0"~D31" per clock cycle. When operating in the syndrome generation mode, the mode control line is set as 1, and the circuit can, per each clock cycle, perform processing on the 2-bit data R(x+0) and R(X+1) input in parallel. Within the $1056^{th}$ cycle, the syndrome for the data of the entire frame is generated after the data of the frame is input. Practical applications may support that the error trapper is expanded according to any-bit parallel input.

Figure 9A:
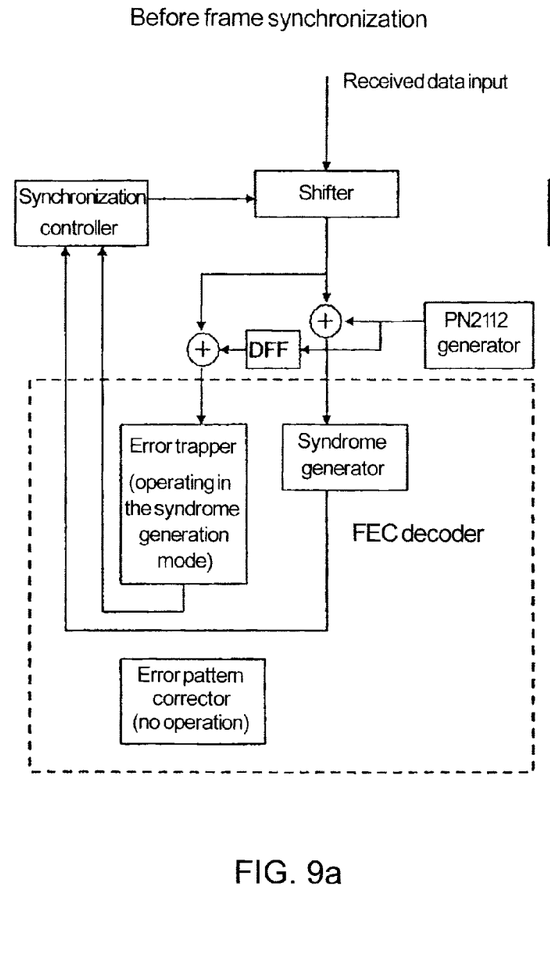
FIGS. 9a and 9b show a structure of an FEC reception layer for input in different modes after the improved error trapper is integrated into an FEC decoding system.
Figure 9B:
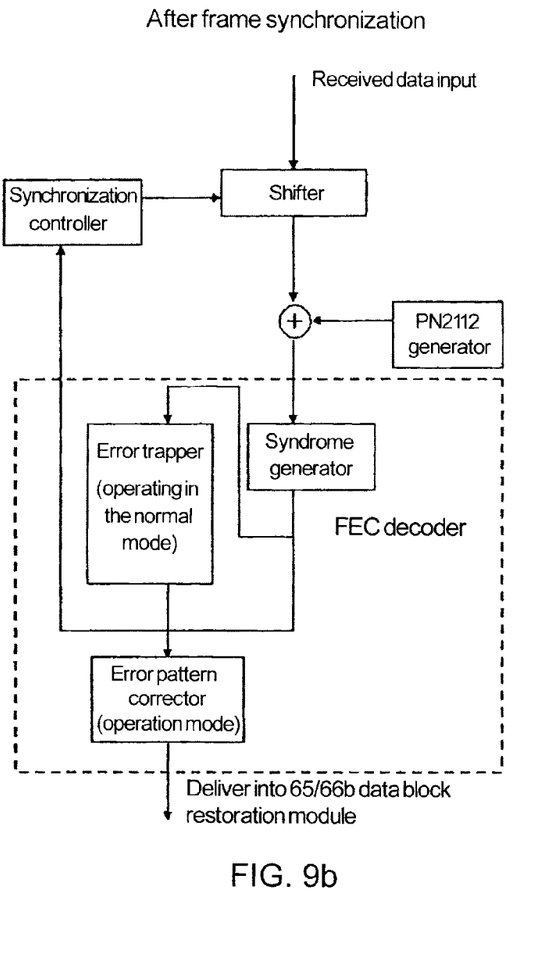

FIG. 9a and FIG. 9b show a structure of an FEC reception layer for an input in different modes after the improved error trapper is integrated into an FEC decoding system. Such a structure for the FEC reception layer contains a frame boundary detection system and synchronization system for a data stream received by an Ethernet Forward Error Correction layer. FIG. 9a and FIG. 9b is applicable to not only serial input data of one bit but also parallel input data of plural bits. According to FIG. 9a, the improved error trapper operates in the syndrome generation mode, and the work flow of the frame boundary detection system is as follows: after the data of one frame plus A bits (2112+A bits where A is a positive integer less than a length of one frame and preferably A=1) is input into the FEC reception layer via the shifter, bits (0, 2111) is directly descrambled with the PN2112 sequence generated by the PN2112 generator through a scrambler (represented by a XOR gate in FIG. 9a), then the syndrome generator is used to perform a first FEC check. At the same time, bits (A, 2112+A) arrive A bit time (BT) later than bits (0, 2111), thus they are descrambled with the PN2112 sequence generated by the PN2112 generator after being delayed by A-stage D trigger through another descrambler (represented by an XOR gate in FIG. 9a), then they are delivered into the error trapper operating in the syndrome generation mode to perform a second FEC check. If the first FEC check or the second FEC check is successful, a frame boundary is detected.

Otherwise, if A is not equal to 1, and if neither the first FEC check nor the second FEC check is correct, the shifter, starting from the first data of the data of one frame plus A bits, shifts backwards two frames plus one bit and re-intercepts data with a length of one frame plus A bits so as to continue performing the above detection procedure. Alternatively, if A is equal to 1, and if neither of the first FEC check nor the second FEC check is correct, the shifter, starting from the first data of the data of one frame plus A bits, shifts backwards two frames plus two bits and re-intercepts data with a length of one frame plus A bits so as to continue performing the above detection procedure. In the synchronization procedure, the above frame boundary detection procedure is used. When a frame boundary is detected, the synchronization controller makes judgments on the FEC checks of the subsequently consecutive n data with each having a length of one frame. If the synchronization controller judges that the FEC check for any one data with a length of one frame among the subsequently consecutive n data with each having a length of one frame is incorrect, the loss of frame synchronization is determined and the frame boundary detection procedure is restarted. If the synchronization controller judges that the FEC checks of the subsequently consecutive n data with each having a length of one frame are all correct, the synchronization controller determines that the data are frame synchronous. The frame synchronization takes the start position of the frame for which the check is correct as the start position of the frame to establish the frame synchronization. At the same time, the error trapper is switched into the error diagnostics mode (the synchronization controller produces the signal), while the syndrome generator may continue tracking the frame check results of the received data. If the synchronization controller detects that the FEC checks of consecutive m data frames received are all incorrect, it is considered that the frame synchronization is lost, and the error trapper is newly switched back to the syndrome generation mode and the entire frame synchronization procedure is restarted. After the frame synchronization, according to FIG. 9b, the error trapper returns to its normal operation mode, that is, the error trapper mode as the existing FEC decoding system.

Therefore, the frame boundary detection system includes a frame boundary detection system for a data stream received by an Ethernet Forward Error Correction layer, the system comprises: a shifter for intercepting data of one frame plus A bits from the data stream where the A bits is less than a length of one frame; two descramblers wherein a first descrambler performs a descrambling operation on the data of one frame starting from the first bit of the data of one frame plus A bits, and a second descrambler performs a descrambling operation on the data of one frame starting from the $(A+1)^{th}$ bit of the data of one frame plus A bits; a syndrome generator for performing a first FEC check on the data descrambled by the first descrambler; an error trapper including a big-little endian mode controller for controlling the big-little endian conversion of the error trapper, and if the error trapper operates in the big endian mode, the error trapper implements the function of the syndrome generator and performs a second FEC check on the data descrambled by the second descrambler; wherein, the first bit of the data of one frame plus A bits is the start position of the frame if the first FEC check is correct, and the $(A+1)^{th}$ bit of the data of one frame plus A bits is the start position of the frame if the second FEC check is correct.

In the system, if A is not equal to 1, and if neither the first FEC check nor the second FEC check is correct, the shifter, starting from the first data of the data of one frame plus A bits, shifts backwards two frames plus one bit, re-intercepts data with a length of one frame plus A bits, and performs descrambling and FEC checks.

In the system, if A is equal to 1, and if neither the first FEC check nor the second FEC check is correct, the shifter, starting from the first data of the data of one frame plus A bits, shifts backwards two frames plus two bits, re-intercepts data with a length of one frame plus A bits, and performs descrambling and FEC checks.

Preferably, the system further includes a PN-2112 generator for generating a PN2112 sequence. Both of the descramblers use the PN2112 sequence generated by PN-2112 generator to perform the descrambling operations.

In a synchronization system, in addition to all the components of the above frame boundary detection system, a synchronization controller for controlling the frame synchronization is included. In the synchronization system, the shifter repeats operations of varying a start position for intercepting data and intercepting data of one frame plus A bits until the first FEC check or the second FEC check is correct. Then the synchronization controller validates the FEC checks of subsequently consecutive n data with each having a length of one frame, and if the synchronization controller judges that the FEC checks of subsequently consecutive n data with each having a length of one frame are all correct, the synchronization controller determines the data to be frame synchronous.

In the synchronization system, if A is not equal to 1, and if the synchronization controller determines the FEC check for any one data with a length of one frame among subsequently consecutive n data with each having a length of one frame is incorrect, the shifter, starting from the first data of the data of one frame plus A bits, shifts backwards two frames plus one bit, re-intercepts data with a length of one frame plus A bits, and re-performs the frame boundary detection.

In the synchronization system, if A is equal to 1, and if the synchronization controller determines the FEC check for any one data with a length of one frame among subsequently consecutive n data with each having a length of one frame is incorrect, the shifter, starting from the first data of the data of one frame plus A bits, shifts backwards two frames plus two bits, re-intercepts data with a length of one frame plus A bits, and re-performs the frame boundary detection.

In the synchronization system, the synchronization controller validating the FEC checks of the subsequently consecutive n data with each having a length of one frame, the FEC checks for subsequently consecutive n data with each having a length of one frame can generally be performed by the syndrome generator.

Generally speaking, the "mode control" signal may be generated by the synchronization controller in FIG. 9a. The signal is the big endian mode when no frame boundary is detected and even before the frame synchronization is determined, so that the error trapper has been operating in the big endian mode, that is, the syndrome generator mode, until the frame synchronization is determined Therefore, there are two syndrome generators to simultaneously detect the frame boundary, determine the frame synchronization procedure, and speed up the frame boundary detection and synchronization procedure. In FIG. 9a, the syndrome generator outputs a syndrome, and the error trapper in the big endian mode also outputs a syndrome. The synchronization controller receives the syndrome generated by the syndrome generator and the syndrome generated by the error trapper in the big endian mode. If neither of the two syndromes is 0, which illustrates that no frame boundary is detected and that the data have not yet been frame synchronous, the synchronization controller causes the shifter to continue receiving data.

The present invention can make two syndrome generators (one being the existing syndrome generator of the system and the other being an improved error trapper operating in the syndrome generation mode) operate in parallel by adding very little hardware. After the frame synchronization, the error trapper may return to its normal operation mode. Further, it is possible for the data of one frame which is discarded due to the pipeline delay in the prior art to be discarded in the present invention. However, the synchronization time can still be greatly reduced as long as A is suitably selected. Alternatively, as technology develops in the future, the pipeline delay is greatly reduced, which still does not degrade the technical effect of the invention.

According to the first embodiment, if A=1, the LFSR only need shift 1055 times at most to detect a correct frame boundary. In the worst case, the operations of detecting 1056 frames (two assumed frame boundaries are detected at one time, which uses the data of 1056 frames), discarding 1055 frames, and shifting one bit for 1055 times are required. In this way, the total time is 2112*(1056+1055)+1055=4,459,487 BT (Bit Time), and the synchronization time is reduced by half as compared with the general method.

Although some exemplary embodiments of the present invention are described with reference to the attached drawings, it should be appreciated that the invention is not limited to these exact embodiments. Various variations and modifications to the embodiments can be made by those skilled in the art without departing from the scope and principle of the invention. All of these variations and modifications are intended to fall within the scope of the invention defined in the attached claims.

TRANSLATION FOR ATTACHED DRAWINGS

FIG. 1
1: FEC decoding system
2: Input from the PMA layer
3: Shifter
4: Synchronization controller
5: Syndrome output
6: FEC decoder
7: Syndrome generator
8: Error trapper
9: Error pattern corrector
10: decoded output of FEC block
11: Restoration of 65/66b data block
12: PN-2112 generator
13: Output to the PCS layer
FIG. 2
1: Input of a first frame
2: Input of a second frame
3: Input of a third frame
4: Assumed start position of a frame
5: Pipeline delay.
6: One bit is leaped over
7: The next assumed start position of a frame
FIG. 3
1: Received data input
2: The received payload of data (2080 bits) are simultaneously stored into RAM.
3: The payload of data (2080 bits) are read out for performing error pattern correction.
4: Syndrome generator
5: Syndrome input control
6: Syndrome
7: Bit 0 of the syndrome
8: Bit 1 of the syndrome
9: Error trapper
10: Bit 31 of the syndrome
11: Error diagnostics comparator
12: Error pattern and error position
13: Error pattern corrector
14: Output of decoded result
FIG. 4
1: Syndrome input control
   0—Linear feedback operation
   1—Syndrome input
2: Mode control
   0—Error diagnostics mode
   1—Syndrome generation mode
3: Bit 0 of the syndrome
4: Bit 1 of the syndrome
5: Bit 31 of the syndrome
6-8: Dual-mode coefficient generator
FIG. 5 and FIG. 7b
Mode control
FIG. 8
1: Syndrome input control
   0—Linear feedback operation
   1—Syndrome input
2: Mode control
   0—Error diagnostics mode
   1—Syndrome generation mode
3: Bit 0 of the syndrome
4: Bit 1 of the syndrome
5: Bit 2 of the syndrome
6: Bit 31 of the syndrome
FIG. 9a
1: Before frame synchronization
2: Received data input
3: Synchronization controller
4: Shifter
5: PN2112 generator
6: Error trapper (operating in the syndrome generation mode)
7: Syndrome generator
8: FEC decoder
9: Error pattern corrector (no operation)
FIG. 9b
1: After frame synchronization
2: Received data input
3: Synchronization controller
4: Shifter
5: PN2112 generator
6: Error trapper (operating in the normal mode)
7: Syndrome generator
8: FEC decoder
9: Error pattern corrector (operation mode)
10: Deliver into 65/66b data block restoration module

What is claimed is:
1. A frame boundary detection system for a data stream received by an Ethernet Forward Error Correction (FEC) layer, comprising:

a shifter for intercepting data of one frame plus A bits from the data stream, wherein the A bits is less than a length of one frame, and A is a positive integer;

two descramblers of which a first descrambler performs a descrambling operation on the data of one frame starting from the first bit of the data of one frame plus A bits, while a second descrambler performs a descrambling operation on the data of one frame starting from the $(A+1)^{th}$ bit of the data of one frame plus A bits;

a syndrome generator for performing a first FEC check on the data descrambled by the first descrambler; and an error trapper including a big-little endian mode controller for controlling a big-little endian conversion of the error trapper, wherein the error trapper is used to perform a second FEC check on the data descrambled by the second descrambler if the error trapper operates in a big endian mode, wherein the first bit of the data of one frame plus A bits is a start position of the frame if the first FEC check is correct, and the $(A+1)^{th}$ bit of the data of one frame plus A bits is the start position of the frame if the second FEC check is correct.

2. The frame boundary detection system according to claim 1, wherein A is not equal to 1, and if neither of the first FEC check and the second FEC check is correct, the shifter, starting from a first data of the data of one frame plus A bits, shifts backwards two frames plus one bit, re-intercepts data with a length of one frame plus A bits, and performs descrambling and FEC checks.

3. The frame boundary detection system according to claim 1, wherein A is equal to 1, and if neither of the first FEC check and the second FEC check is correct, the shifter, starting from a first data of the data of one frame plus A bits, shifts backwards two frames plus two bits, re-intercepts data with a length of one frame plus A bits, and performs descrambling and FEC checks.

4. The frame boundary detection system according to claim 3, further comprising a PN-2112 generator for generating a PN-2112 sequence which is used by both of the two descramblers to perform descrambling operations.

5. The frame boundary detection system according to claim 3, wherein the first FEC check and the second FEC check are modular operation of g(x) which is a Forward Error Correction generation polynomial, and an obtained residue is a syndrome, and the first FEC check is correct if the syndrome is 0.

6. The frame boundary detection system according to claim 5, wherein the error trapper comprises:

a 32-order linear feedback shift register composed of 32 registers, 31 XOR gates and 31 AND gates, wherein an input of each AND gate is a least significant bit D0 of the 32-order linear feedback shift register and a coefficient $g_x$ of the generation polynomial g(x) corresponding to a position x respectively, and an output of each AND gate, after an XOR operation is performed with an output of a register of more significant bit, is delivered into a register of less significant bit, wherein the most significant bit of the register is D31;

32 selectors for the error trapper shielding the syndrome generated by the syndrome generator in the big endian mode, wherein the big-little endian mode controller comprises:

31 dual-mode coefficient generators for selecting values for an input coefficient of the AND gate in different operation modes; and a selector and an XOR gate located in front of the input of the register of the most significant bit D31 for selecting either the value of D0 or a value after D0 is XOR'd with the data of one frame starting from the $(A+1)^{th}$ bit of the received data of one frame plus A bits to be delivered into D31, a control terminal of the selector being controlled by a "mode control" signal, wherein the value after D0 is XOR'd with the data of one frame starting from the $(A+1)^{th}$ bit of the received data of one frame plus A bits is selected to be output to the selector if the "mode control" signal is in the big endian mode, and the value of D0 is selected to be output to the selector if the "mode control" signal is in a little endian mode.

7. The frame boundary detection system according to claim 6, wherein a dual-mode coefficient generator is a selector of which a control terminal is controlled by the "mode control" signal, wherein $g_{32-x}$, which is a coefficient of the generation polynomial g(x) corresponding to a position 32-x, is selected to be input into each of said AND gates if the "mode control" signal indicates the big endian mode, and $g_x$ is selected to be input into each of said AND gates if the "mode control" signal indicates the little endian mode.

8. The frame boundary detection system according to claim 7, wherein the dual-mode coefficient generator makes the selection according to coefficients of a Forward Error Correction generation polynomial g(x), wherein if the coefficient $g_x$ of the generation polynomial g(x) corresponding to the position x and the coefficient $g_{32-x}$ of the generation polynomial g(x) corresponding to the position 32-x are equal, $g_x$ is input into each of said AND gates, otherwise, $g_x$, after being XOR'd with the "mode control" signal, is input into each of said AND gates.

9. The frame boundary detection system according to claim 8, further comprising a synchronization controller for generating the "mode control" signal which indicates the big endian mode until a frame boundary is detected.

10. The frame boundary detection system according to claim 9, wherein the syndrome generator outputs a syndrome, and the error trapper in the big endian mode outputs a syndrome, and the synchronization controller receives the syndrome generated by the syndrome generator and the syndrome generated by the error trapper in the big endian mode, wherein the synchronization controller controls the shifter to continue receiving data if neither of said syndromes is 0.

11. A synchronization system for a data stream received by an Ethernet Forward Error Correction layer, comprising:

the frame boundary detection system according to claim 10; and a synchronization controller for controlling the frame synchronization, wherein the synchronization controller validates the FEC checks of subsequently consecutive n data with each having a length of one frame after the frame boundary detection system detects a start position of a frame, and if the synchronization controller determines the FEC checks of subsequently consecutive n data with each having a length of one frame are all correct, the synchronization controller determines the data to be frame synchronous.

12. The synchronization system according to claim 11, wherein if A is not equal to 1, and if the synchronization controller determines the FEC check for any one data with a length of one frame among subsequently consecutive n data with each having a length of one frame is incorrect, the shifter, starting from the first data of the data of one frame plus A bits, shifts backwards two frames plus one bit, re-intercepts data with a length of one frame plus A bits, and re-performs the frame boundary detection.

13. The synchronization system according to claim 11, wherein if A is equal to 1, and if the synchronization controller determines the FEC check for any one data with a length of one frame among subsequently consecutive n data with each having a length of one frame is incorrect, the shifter, starting from the first data of the data of one frame plus A bits, shifts backwards two frames plus two bits, re-intercepts data with a length of one frame plus A bits, and re-performs the frame boundary detection.

14. The synchronization system according to claim 13, wherein the "mode control" signal generated by the synchronization controller indicates the big endian mode until the frame synchronization is validated.

15. The synchronization system according to claim 14, wherein in the synchronization controller making determinations on the FEC checks of subsequently consecutive n data with each having a length of one frame, the FEC checks of subsequently consecutive n data with each having a length of one frame are performed by the syndrome generator.

16. The synchronization system according to claim 15, wherein the syndrome generator outputs a syndrome, and the error trapper in the big endian mode outputs a syndrome, and the synchronization controller receives the syndrome generated by the syndrome generator and the syndrome generated by the error trapper in the big endian mode, wherein the synchronization controller controls the shifter to continue receiving data if neither of the syndromes is 0.

* * * * *